(12) United States Patent
Zhao et al.

(10) Patent No.: US 10,079,538 B2
(45) Date of Patent: Sep. 18, 2018

(54) BOOTSTRAP CIRCUIT FOR DC/DC CONVERTER

(71) Applicant: TEXAS INSTRUMENTS INCORPORATED, Dallas, TX (US)

(72) Inventors: Xiaochun Zhao, Allen, TX (US); Hasibur Rahman, Wylie, TX (US); Artur Lewinski, Dallas, TX (US); Tulong Yang, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 15/296,733

(22) Filed: Oct. 18, 2016

(65) Prior Publication Data
US 2018/0109179 A1 Apr. 19, 2018

(51) Int. Cl.
*G05F 1/10* (2006.01)
*H02M 3/07* (2006.01)

(52) U.S. Cl.
CPC .................................. *H02M 3/07* (2013.01)

(58) Field of Classification Search
CPC ...................................................... H02M 3/07
USPC .................. 327/536, 589, 390; 323/311, 271
See application file for complete search history.

(56) References Cited

U.S. PATENT DOCUMENTS

| 2013/0021015 | A1* | 1/2013 | Moussaoui | H02M 3/1582 323/311 |
|---|---|---|---|---|
| 2016/0043642 | A1 | 2/2016 | Xu | |
| 2016/0294285 | A1 | 10/2016 | Le Men et al. | |

FOREIGN PATENT DOCUMENTS

RU 161785 U1 5/2016

OTHER PUBLICATIONS

PCTSearch Report for Application No. PCT/US 2017/057262, dated Feb. 14, 2018.

* cited by examiner

*Primary Examiner* — Thomas Skibinski
(74) *Attorney, Agent, or Firm* — Lawrence J. Bassuk; Charles A. Brill; Frank D. Cimino (57) ABSTRACT

A circuit includes a charge pump to generate an output reference voltage. A first bootstrap refresh circuit receives the reference voltage from the charge pump and is coupled between first and second bootstrap nodes of a DC/DC converter. The first bootstrap refresh circuit supplies first charge current that is sourced from the first bootstrap node to the second bootstrap node based on a control signal indicating a first operating mode of the DC/DC converter. A second bootstrap refresh circuit receives the reference voltage from the charge pump and is coupled between the first and second bootstrap nodes of the DC/DC converter. The second bootstrap refresh circuit supplies second charge current from the second bootstrap node to the first bootstrap node based on the control signal indicating a second operating mode of the DC/DC converter.

20 Claims, 5 Drawing Sheets

BOOTSTRAP CIRCUIT FOR DC/DC CONVERTER

TECHNICAL FIELD

This disclosure relates to integrated circuits and, more particularly, to a circuit to provide bootstrap charging current for a DC/DC converter.

BACKGROUND

Direct current to direct current (DC/DC) converters represent a primary category for power supply design. A switched-mode DC/DC converter can achieve and may exceed ninety percent power conversion efficiency and thus has been widely used to efficiently supply power in all types of electronic devices, such as computers, cell phones, televisions, automobiles, and so forth. The DC/DC converter can provide various input and output conversion modes depending on the application. For example, buck-mode converters convert a larger input voltage into a smaller DC output voltage. Boost-mode converters boost a smaller input voltage into a higher DC output voltage. Some configurations provide buck and boost capabilities to maintain a substantially constant voltage between input and output. For some applications, it may be necessary to provide buck, boost, and buck/boost mode capabilities. For example, in some automotive applications, boost mode may be selected to supply power during cold start as the battery comes up to its normal operating voltage which is usually about twelve volts. After achieving normal voltage, other lower voltages than the battery voltage may be needed for electronic circuits where buck mode would be employed to supply such voltages. In order to support multiple converter operating modes, bootstrap circuits may be employed to supply power to inactive portions of the DC converter which support the current inactive modes of the converter.

SUMMARY

This disclosure relates to circuit to provide bootstrap circuit for a DC/DC converter.

In one example, a circuit includes a charge pump to generate an output reference voltage. A first bootstrap refresh circuit receives the reference voltage from the charge pump. The first bootstrap refresh circuit is further coupled between first and second bootstrap nodes of a DC/DC converter. The first bootstrap refresh circuit supplies first charge current that is sourced from the first bootstrap node to the second bootstrap node for charging a capacitor based on a control signal indicating a first operating mode of the DC/DC converter to facilitate bootstrap in response to switching from the first operating mode to a second operating mode. A second bootstrap refresh circuit receives the reference voltage from the charge pump. The second bootstrap refresh circuit is further coupled between the first and second bootstrap nodes of the DC/DC converter. The second bootstrap refresh circuit supplies second charge current from the second bootstrap node to the first bootstrap node for charging the capacitor based on the control signal indicating the second operating mode of the DC/DC converter to facilitate bootstrap in response to switching from the second operating mode to the first operating mode.

In another example, a circuit includes a charge pump to generate an output reference voltage. A first refresh control circuit includes a first voltage input to receive the reference voltage from the charge pump. The first refresh control circuit generates a first output current based on the reference voltage and in response to a control signal input. A first charge circuit is coupled to the first refresh circuit to supply first charge current from a first bootstrap node of a DC/DC converter to a second bootstrap node based on the first output current from the first refresh control circuit. A second refresh control circuit includes a second voltage input to receive the reference voltage from the charge pump. The second refresh control circuit generates a second output current based on the reference voltage and in response to the control signal input. A second charge circuit is coupled to the second refresh circuit to supply second charge current from the second bootstrap node of the DC/DC converter to the second bootstrap node based on the second output current from the second refresh control circuit.

In yet another example, an integrated circuit includes a semiconductor substrate, and a charge pump that generates a reference voltage across at least one charging capacitor. The charge pump and the charging capacitor are formed on the semiconductor substrate. A first bootstrap refresh circuit is formed on the semiconductor substrate and receives the reference voltage from the charge pump. The first bootstrap refresh circuit is further coupled between first and second bootstrap nodes of a DC/DC converter. The first bootstrap refresh circuit supplies first charge current that is sourced from the first bootstrap node to the second bootstrap node based on a control signal indicating a first operating mode of the DC/DC converter. A second bootstrap refresh circuit is formed on the semiconductor substrate receives the reference voltage from the charge pump. The second bootstrap refresh circuit is further coupled between the first and second bootstrap nodes of the DC/DC converter. The second bootstrap refresh circuit supplies second charge current from the second bootstrap node to the first bootstrap node based on the control signal indicating a second operating mode of the DC/DC converter.

DETAILED DESCRIPTION

This disclosure relates to a circuit to provide bootstrap charging current for a DC/DC converter. The DC/DC converter includes buck, boost, and buck-boost mode capabilities where bootstrap capacitors are utilized in the converter to provide starting voltages for inactive switching circuits in the converter. For example, in buck mode, buck-side driver circuits are active to drive an inductor which is connected to a boost side driver circuit to provide a return current path for the inductor. In buck mode, most of the boost-side circuit is inactive other than providing the return current path for the active boost side circuit. In order to support dynamic switchover from buck mode to boost mode (or vice versa), bootstrap capacitors are charged to support the switchover operation. In some existing approaches, bootstrap capacitors were charged directly via an external charge pump (e.g., external to a semiconductor integrated circuit (IC)). This external connection to the charge pump required extra pins on the IC along with added expense of more robust charging components for the charge pump.

The bootstrap charging circuit, as disclosed herein, includes a refresh control and charging circuit that utilizes the active converter-side bootstrap capacitor, which is charged due to switching action of the converter, to charge the bootstrap capacitor on the opposite and inactive side of the converter. The charging current is drawn from a charged circuit component in the converter as opposed to being sourced externally and exclusively by an external charge pump as in some existing circuits. As such, the bootstrap charging circuit can employ much smaller charging components (e.g., capacitors, buffers) to enable the charge pump to be implemented as an internal semiconductor circuit on a common substrate along with other converter circuits. By directing charging currents from one bootstrap capacitor to another and utilizing an internal charge pump as a control reference, as opposed to sourcing the bootstrap charging current from an external charge pump, semiconductor implementations, according to this disclosure, can be provided that utilize fewer external semiconductor connections to large external components which helps to reduce costs.

Figure 1:
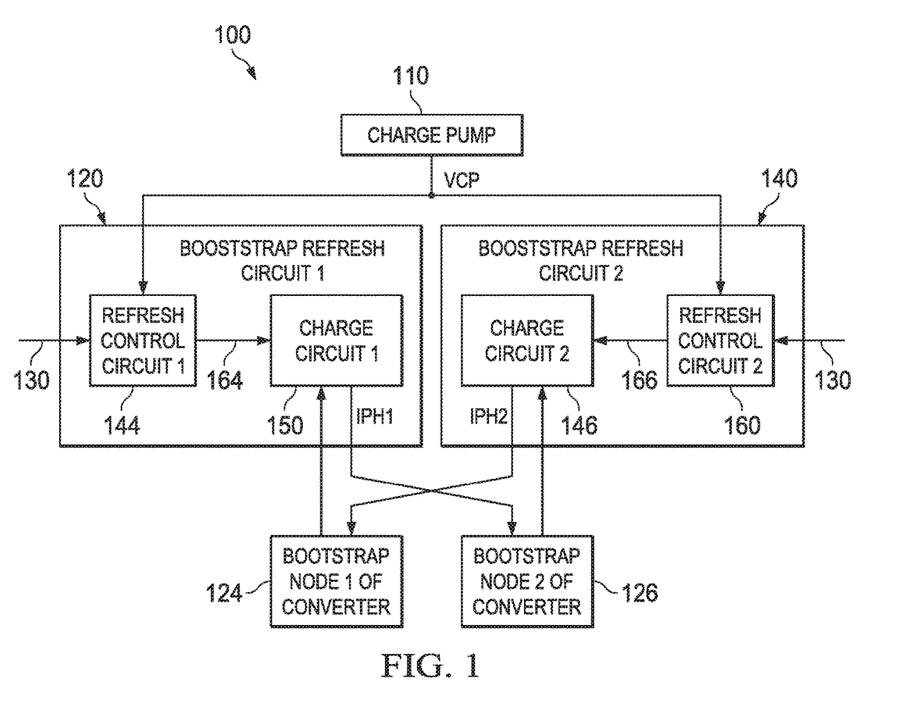
FIG. 1 illustrates an example schematic block diagram of bootstrap charging circuit for a DC/DC converter circuit.

FIG. 1 illustrates an example of bootstrap charging circuit 100 for a DC/DC converter circuit. As used herein, the term circuit can include a collection of active and/or passive elements that perform a circuit function such as an analog circuit or control circuit, for example. Additionally or alternatively, the term circuit can include an integrated circuit (IC) where all and/or some of the circuit elements are fabricated on a common substrate (e.g., semiconductor substrate), for example.

As shown in the example of FIG. 1, the circuit 100 includes a charge pump 110 to generate an output reference voltage shown as voltage charge pump (VCP). As used herein, a charge pump is a type of DC/DC converter that uses capacitors as energy-storage elements to create either a higher or lower-voltage power source. Charge pumps use some form of switching device(s) to control the connection of voltages to the capacitor (see e.g., FIG. 3). A first bootstrap refresh circuit 120 receives the reference voltage VCP from the charge pump 110. The first bootstrap refresh circuit 120 is further coupled between first and second bootstrap capacitor nodes 124 and 126 of a DC/DC converter. The first bootstrap refresh circuit 120 supplies first charge current that is sourced from the first bootstrap capacitor node 124 to the second bootstrap capacitor node 126 via a first charging path IPH1 based on a control signal 130 indicating a first operating mode of the DC/DC converter. A second bootstrap refresh circuit 140 also receives the reference voltage VCP from the charge pump 110. The second bootstrap refresh circuit 140 is further coupled between the first and second bootstrap capacitor nodes 124 and 126 of the DC/DC converter. The second bootstrap refresh circuit 140 supplies second charge current from the second bootstrap capacitor node 126 to the first bootstrap capacitor node 124 via a second charge path IPH2 based on the control signal 130 indicating a second operating mode of the DC/DC converter.

Each of the first and second bootstrap refresh circuits 120 and 140 include a refresh control circuit 144 and 146 respectively to control the first charge and second charge current over charging paths IPH1 and IPH2 based on the reference voltage VCP and control signal 130. Each of the refresh control circuits 144 and 146 drive an associated charge circuit 150 and 160 that supplies the first charge current and second charge current, respectively to each of the first and second bootstrap capacitor nodes 124 and 126 based on a current signal shown at 164 and 166 and the control signal 130 indicating either the first or second operating mode. For example, the control signal 130 may indicate the operating mode of the DC/DC converter as a boost, buck or buck/boost mode.

As will be illustrated and described below with respect to FIGS. 3 and 4, each of the refresh control circuits 144 and 146 and the associated charge circuits 150 and 160 are coupled via a current mirror to generate the current signal 164 and 166 and to control the first charge and second charge current, respectively based on the reference voltage VCP. Each of the current mirrors can be biased based on relative resistance in the current mirrors resistor network that is configured to control the current signal 164 and 166, respectively. In some examples, the charge pump 110 can operate on a common semiconductor substrate with the first and second bootstrap refresh circuits 120 and 140. As such, external charge pump pins and components can be removed which in turn reduces circuit costs over existing approaches. The charge pump 110 can also include a buffer that drives a charging capacitor (or capacitors) to generate the reference voltage VCP, where each of the buffer and the charging capacitor(s) can operate on the semiconductor substrate with other converter circuits, such as disclosed herein.

Figure 2:
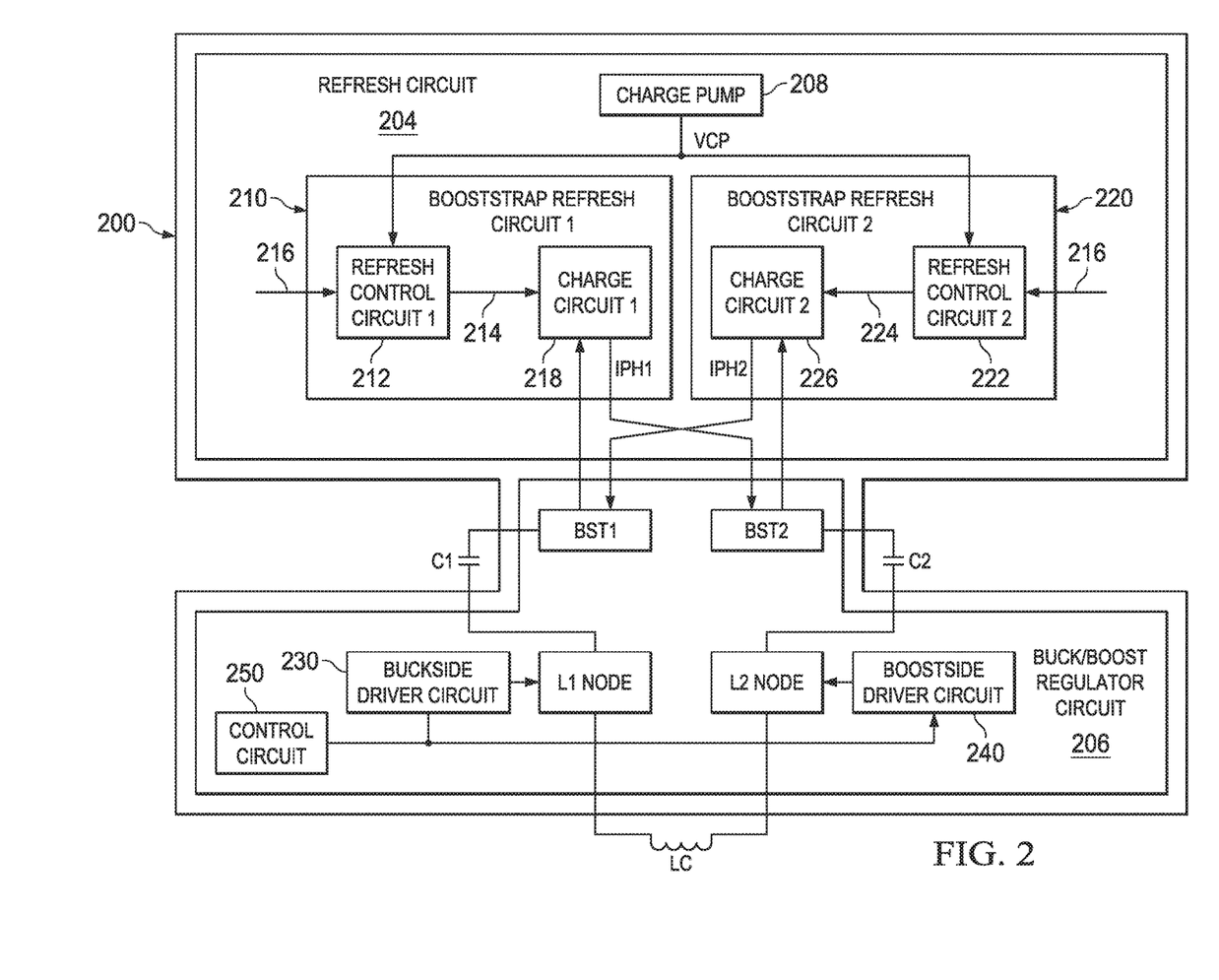
FIG. 2 illustrates an example schematic block diagram of a bootstrap charging circuit and driver circuits for a DC/DC converter circuit.

FIG. 2 illustrates an example of a bootstrap charging circuit and driver circuits for a DC/DC converter circuit 200. The circuit 200 can be implemented on a common semiconductor substrate operates with external bootstrap capacitors C1 and C2 along with converter inductor LC to provide DC/DC converter operations as described herein. The circuit 200 includes a refresh circuit 204 and a buck/boost regulator circuit 206. A charge pump 208 generates an output reference voltage VCP for a first bootstrap refresh circuit 210. A first refresh control circuit 212 includes a voltage input to receive the reference voltage VCP from the charge pump 208. The first refresh control circuit 212 generates an output current as a current signal 214 based on the reference voltage VCP and in response to a control signal input 216. A first charge circuit 218 supplies charge current from a first bootstrap capacitor node BST1 of a DC/DC converter based on the output current 214 from the first refresh control circuit 212. The charge current is sourced from the first bootstrap capacitor node BST1 to a second bootstrap capacitor node BST2 via the first charge circuit 218 via charging path IPH1

A second bootstrap refresh circuit 220 includes a second refresh control circuit 222 which includes a voltage input to receive the reference voltage VCP from the charge pump 208. The second refresh control circuit 222 generates an output current via current signal 224 based on the reference voltage VCP and in response to the control signal input 216. A second charge circuit 226 supplies charge current from the second bootstrap capacitor node BST2 of the DC/DC converter based on the output current from signal 224 of the second refresh control circuit 222. The charge current is sourced from the second bootstrap capacitor node BST2 to the first bootstrap capacitor node BST1 via the second charge circuit 226 and the second charging path IPH2. As shown, bootstrap capacitors C1 and C2 can be coupled between the respective bootstrap nodes BST1 and BST2 and at opposite ends of the converter inductor LC which is also coupled to converter nodes L1 and L2.

The first refresh control circuit 212 and the first charge circuit 218 can be coupled via a first current mirror (see e.g., FIG. 3) to control the first charge current based on the reference voltage VCP and the first current signal 214.

Similarly, the second refresh control circuit 222 and the second charge circuit 226 can be coupled via a second current mirror to control a second charge current based on the reference voltage VCP and the second current signal 224. Each of the first and second current mirrors can be biased via configuration resistors (e.g., matched resistor pair). The relative resistance between the configuration resistors may be set to control the respective current signal of the current mirrors. In some examples, the charge pump 208 is implemented on a common semiconductor substrate with the first and second refresh control circuits 212 and 222 and the first and second charge circuits 218 and 226, respectively.

The charge pump 208 can include a buffer that drives a charging capacitor to generate the reference voltage VCP where each of the buffer and the charging capacitor operate on the semiconductor substrate. In the example of FIG. 2, the buck/boost regulator circuit 206 includes a buck side driver circuit 230 to drive a first inductor node L1 (in buck mode) of the DC/DC converter that is operative with the first bootstrap capacitor node BST1. A boost side driver circuit 240 drives a second inductor node L2 (in boost mode) of the DC/DC converter that is operative with the second bootstrap capacitor BST2. A regulator control circuit 250 controls the direction of current flow between first and second inductor nodes L1 and L2 of the DC/DC converter. In buck mode, the buck side driver circuit 230 drives an alternating current (AC) (e.g., square wave) signal into the inductor via the L1 node whereas the boost side driver circuit 240 is relatively inactive (non-switching mode) and provides a ground return path for the inductor LC via node L2. During buck mode, C1 is charging and supplies charging current to BST2 and C2 via the first charge circuit 218.

Conversely, in boost mode, the boost side driver circuit 240 drives an AC signal into the inductor via the L2 node whereas the buck side driver circuit 230 is relatively inactive (non-switching mode) and provides a ground return path for the inductor LC via node L1. During boost mode, C2 is charging and supplies charging current to BST1 and C1 via the second charge circuit 226. The control circuit 250 controls the operation of the DC/DC converter that includes at least one of a buck mode operation, a boost mode operation, and a buck/boost mode operation, where buck/boost refers to intermittent switching between buck and boost to regulate the output voltage.

Figure 3:
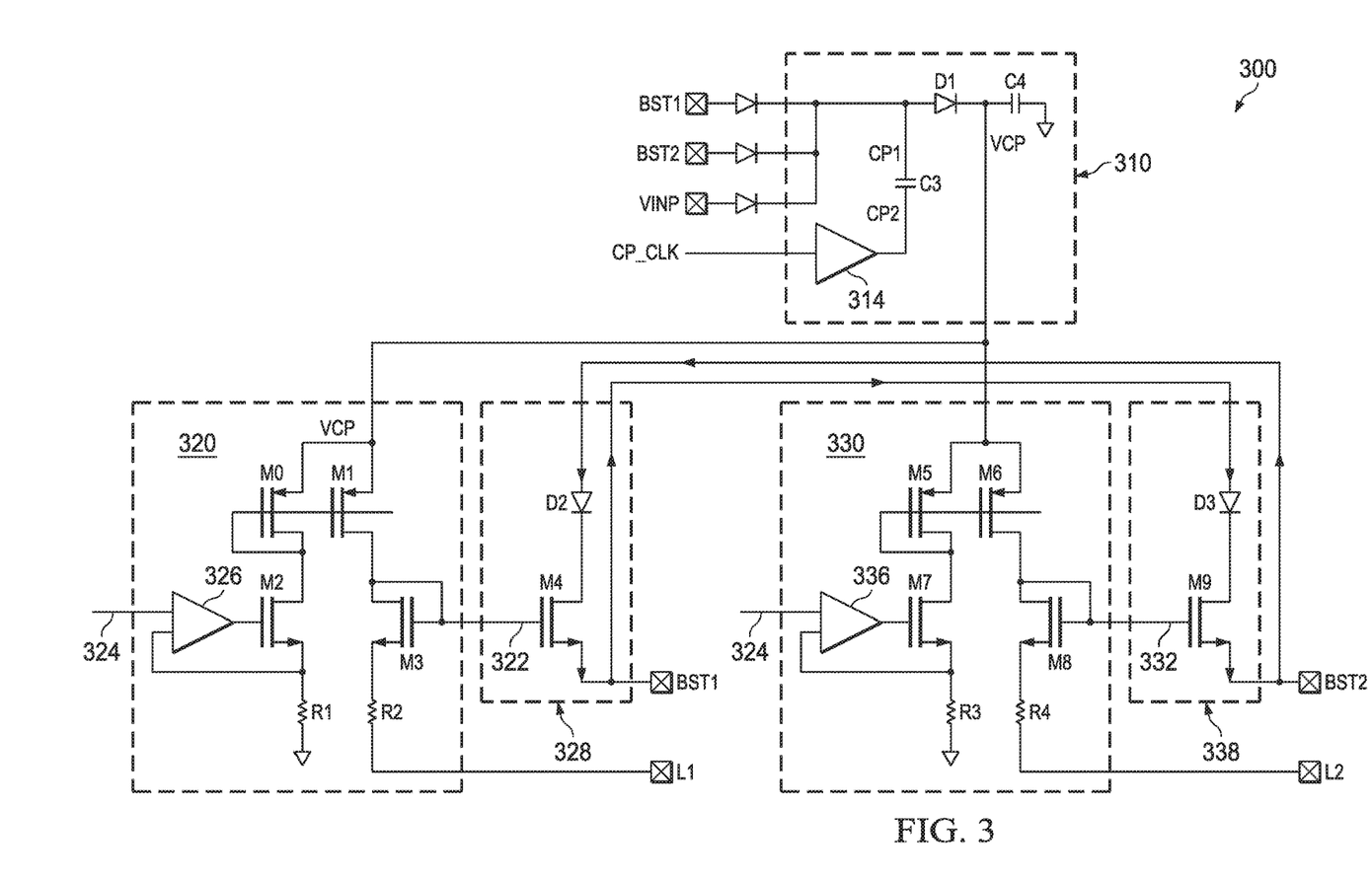
FIG. 3 illustrates an example circuit diagram of bootstrap charging circuit for a DC/DC converter circuit.

FIG. 3 illustrates an example of a bootstrap charging circuit 300 for a DC/DC converter circuit, such as can be employed to implement charge circuit 150, 160, 218 and/or 226. The circuit 300 includes a charge pump 310 to generate an output reference voltage shown as voltage charge pump (VCP). The charge pump 310 includes a buffer 314 that is driven from a charge pump clock CP_CLK and in turn drives a charge pump capacitor C3 and node CP2 which is in series with diode D1 and a second charge pump capacitor C4. A node CP1 coupled to D1 receives voltages from bootstrap nodes BST1 and BST2 along with the input voltage to the converter shown as VINP.

A first refresh control circuit 320 receives the reference voltage VCP from the charge pump 310. The first refresh control circuit 320 generates an output current as a current signal 322 based on the reference voltage VCP and in response to a control signal input 324. The first refresh control circuit 320 includes transistor switch devices M0 and M1 which receive VCP and are coupled to M2 and M3 through matched resistors R1 and R2 which control the current signal 322. A buffer 326 receives the control signal 324 and drives device M2 in response to the control signal. A first charge circuit 328 that includes transistor device M4 and diode D2 supplies charge current from a first bootstrap capacitor node BST1 of a DC/DC converter based on the output current 322 from the first refresh control circuit 320. The charge current is sourced from the first bootstrap capacitor node BST1 to a second bootstrap capacitor node BST2 via the first charge circuit 328.

A second refresh control circuit 330 receives the reference voltage VCP from the charge pump 310. The second refresh control circuit 330 generates an output current as a current signal 332 based on the reference voltage VCP and in response to the control signal input 324. The second refresh control circuit 330 includes transistor switch devices M5 and M6 which receive VCP and are coupled to M7 and M8 through matched resistors R3 and R4 which control the current signal 332. A buffer 336 receives the control signal 324 and drives device M7 in response to the control signal. A second charge circuit 338 that includes transistor device M9 and diode D3 supplies charge current from the second bootstrap capacitor node BST2 of a DC/DC converter based on the output current 332 from the second refresh control circuit 330. The charge current is sourced from the second bootstrap capacitor node BST2 to the first bootstrap capacitor node BST1 via the second charge circuit 338.

The first refresh control circuit 320 and the first charge circuit 328 can be coupled via a first current mirror formed from M3 and M4 to control the first charge current based on the reference voltage VCP and the first current signal 322. Similarly, the second refresh control circuit 330 and the second charge circuit 338 can be coupled via a second current mirror formed from M8 and M9 to control a second charge current based on the reference voltage VCP and the second current signal 332. Each of the first and second current mirrors can be biased via a resistor pair R1/R2 and R3/R4, which is configured to control the respective current signals 322 and 332 of the current mirrors. FIGS. 4A and 4B illustrate how the bootstrap charging circuit 300 can be utilized to provide bootstrap charging with a DC/DC converter.

Figure 4A:
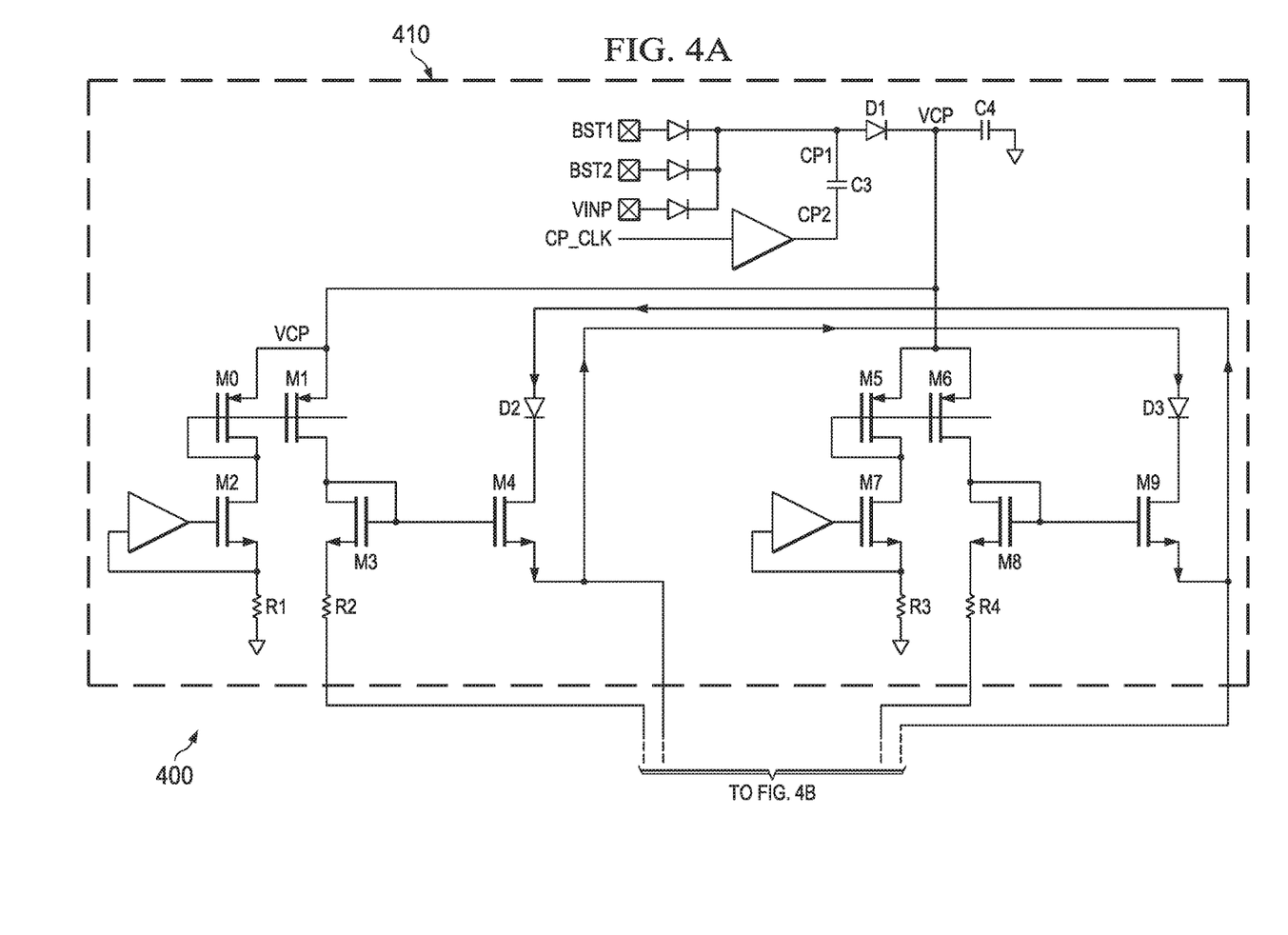
FIGS. 4A and 4B illustrate an example circuit diagram of bootstrap charging circuit and driver circuits for a DC/DC converter circuit.
Figure 4B:
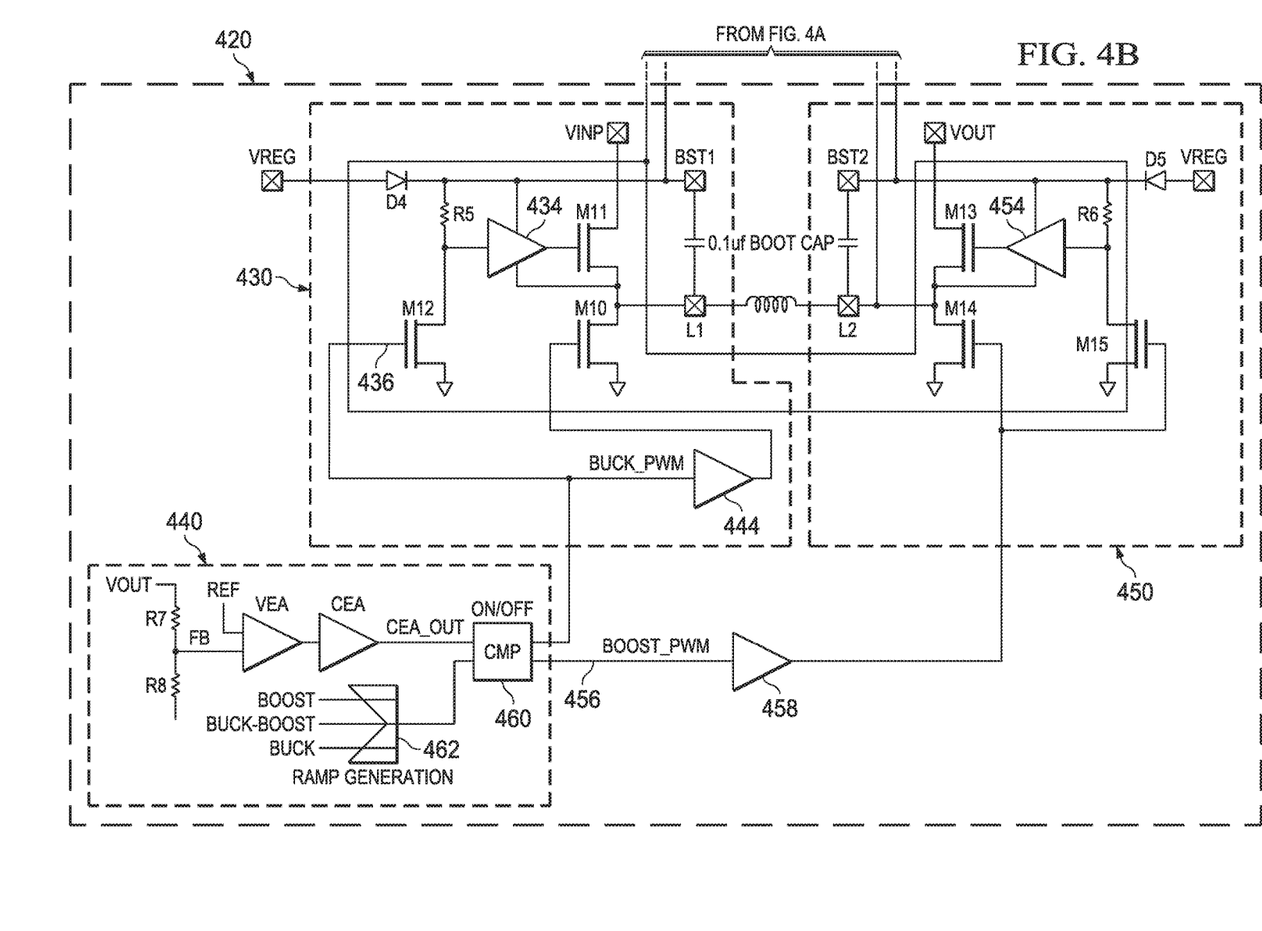

FIGS. 4A and 4B illustrate an example circuit 400 of bootstrap charging circuit and driver circuits for a DC/DC converter circuit. The bootstrap charging circuit described above with respect to FIG. 3 is shown within box 410 of FIG. 4A. For purposes of brevity, each of the components in box 410 will not be further described. The charging circuit of FIG. 4A is coupled to a buck/boost regulator circuit 420 of FIG. 4B. The circuit 420 can include a buck side driver circuit 430 to drive a first inductor node L1 (in buck mode) of the DC/DC converter that is operative with the first bootstrap capacitor node BST1. The buck side driver circuit 430 includes transistor switch devices M10 and M11 which are coupled to the input voltage VINP of the converter. M11 is driven from buffer 434 which is connected to diode D4 and resistor R5. Transistor M12 drives buffer 434 in response to control signal 436 from a controller 440. The control signal 436 output from the controller 440 drives buffer 444 which controls the switching action of M10 and M12.

A boost side driver circuit 450 drives a second inductor node L2 (in boost mode) of the DC/DC converter that is operative with the second bootstrap capacitor node BST2. The boost side driver circuit 450 includes transistor switch devices M13 and M14 which are coupled to the output voltage VOUT of the converter. M13 is driven from buffer 454 which is connected to diode D5 and resistor R6. Transistor M15 drives buffer 454 in response to control signal 456 from the controller 440. The output 456 from the controller 440 drives buffer 458 which controls the switching action of M14 and M15.

The controller 440 includes a comparator 460 which determines regulator mode (e.g., buck, boost, buck/boost based on a ramp signal from ramp circuit 462. Based on the steepness of the ramp signal, controls whether the circuit 420 is in buck (VINP greater than VOUT), boost (VINP less than VOUT), or buck/boost mode (VINP about equal to VOUT). The comparator 460 compares the ramp signal from ramp circuit 462 with a current error amplifier signal CEA_OUT to generate converter control signals 436 and 456. The signal CEA_OUT is drive via current error amplifier CEA which is in turn from voltage error amplifier VEA. The amplifier VEA monitors VOUT via divider network of R7 and R8 with respect to a predetermined threshold setting REF to control VOUT.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
   a charge pump to generate an output reference voltage;
   a first bootstrap refresh circuit coupled to receive the reference voltage from the charge pump, the first bootstrap refresh circuit further coupled between first and second bootstrap nodes of a DC/DC converter, the first bootstrap refresh circuit to supply first charge current, the first charge current sourced from the first bootstrap node to the second bootstrap node for charging a capacitor based on a control signal indicating a first operating mode of the DC/DC converter to facilitate bootstrap in response to switching from the first operating mode to a second operating mode; and
   a second bootstrap refresh circuit coupled to receive the reference voltage from the charge pump, the second bootstrap refresh circuit further coupled between the first and second bootstrap nodes of the DC/DC converter, the second bootstrap refresh circuit to supply second charge current from the second bootstrap node to the first bootstrap node for charging the capacitor based on the control signal indicating the second operating mode of the DC/DC converter to facilitate bootstrap in response to switching from the second operating mode to the first operating mode.

2. The circuit of claim 1, wherein the first bootstrap refresh circuit includes a first refresh control circuit to control the first charge current based on the reference voltage and the second bootstrap refresh circuit includes a second refresh control circuit to control the second charge current based on the reference voltage.

3. The circuit of claim 2, wherein the first refresh control circuit drives a first charge circuit that supplies the first charge current to the second bootstrap node based on a first current signal and the control signal indicating the first operating mode, and the second refresh control circuit drives a second charge circuit that supplies the second charge current to the first bootstrap node based on a second current signal and the control signal indicating the second operating mode.

4. The circuit of claim 3, wherein the first refresh control circuit and the first charge circuit is coupled via a first current mirror to generate the first current signal and to control the first charge current based on the reference voltage, and the second refresh control circuit and the second charge circuit is coupled via a second current mirror to generate the second current signal and to control the second charge current based on the reference voltage.

5. The circuit of claim 4, further comprising a first bias resistor in the first refresh control circuit that is matched with a second bias resistor in the first current mirror to control the first current signal, a third bias resistor in the second refresh control circuit that is matched with a fourth bias resistor in the second current mirror to control the second current signal.

6. The circuit of claim 1, further comprising a semiconductor substrate, each of the charge pump and the first and second bootstrap refresh circuits disposed on the semiconductor substrate.

7. The circuit of claim 6, wherein the charge pump further comprises a buffer and a charging capacitor disposed on the semiconductor substrate, the buffer drives the charging capacitor to generate the reference voltage.

8. The circuit of claim 1, further comprising a buck side driver circuit to drive a first inductor node of the DC/DC converter that is coupled to the first bootstrap node and a boost side driver circuit to drive a second inductor node of the DC/DC converter that is coupled to the second bootstrap node.

9. The circuit of claim 8, further comprising a regulator control circuit to control the direction of current flow between first and second inductor nodes of the DC/DC converter.

10. The circuit of claim 9, wherein the regulator control circuit controls operation of the DC/DC converter to include at least one of a buck operating mode, a boost operating mode, and a buck/boost operating mode.

11. A circuit, comprising:
    a charge pump to generate a reference voltage;
    a first refresh control circuit that includes a first voltage input to receive the reference voltage from the charge pump, the first refresh control circuit generates a first output current based on the reference voltage and in response to a control signal input;
    a first charge circuit coupled to the first refresh control circuit to supply first charge current from a first bootstrap node of a DC/DC converter to a second bootstrap node based on the first output current from the first refresh control circuit;
    a second refresh control circuit that includes a second voltage input to receive the reference voltage from the charge pump, the second refresh control circuit generates a second output current based on the reference voltage and in response to the control signal input; and
    a second charge circuit coupled to the second refresh control circuit to supply second charge current from the second bootstrap node of the DC/DC converter to the second bootstrap node based on the second output current from the second refresh control circuit.

12. The circuit of claim 11, wherein the first refresh control circuit and the first charge circuit are coupled via a first current mirror to control the first charge current based on the reference voltage and a first current signal.

13. The circuit of claim 12, wherein the second refresh control circuit and the second charge circuit are coupled via a second current mirror to control the second charge current based on the reference voltage and a second current signal.

14. The circuit of claim 11, further comprising a semiconductor substrate, each of the charge pump and the first and second refresh control circuits and the first and second charge circuits disposed on the semiconductor substrate.

15. The circuit of claim 14, wherein the charge pump further comprises a buffer and a charging capacitor disposed on the semiconductor substrate, the buffer drives the charging capacitor to generate the reference voltage.

16. The circuit of claim 11, further comprising a buck side driver circuit to drive a first inductor node of the DC/DC converter that is coupled to the first bootstrap node and a boost side driver circuit to drive a second inductor node of the DC/DC converter that is coupled to the second bootstrap node.

17. The circuit of claim 16, further comprising a regulator control circuit to control the direction of current flow between first and second inductor nodes of the DC/DC converter.

18. An integrated circuit, comprising:
a semiconductor substrate;
a charge pump to generate a reference voltage across at least one charging capacitor, the charge pump and the charging capacitor being formed on the semiconductor substrate;
a first bootstrap refresh circuit formed on the semiconductor substrate coupled to receive the reference voltage from the charge pump, the first bootstrap refresh circuit further coupled between first and second bootstrap nodes of a DC/DC converter, the first bootstrap refresh circuit to supply first charge current, the first charge current sourced from the first bootstrap node to the second bootstrap node based on a control signal indicating a first operating mode of the DC/DC converter; and
a second bootstrap refresh circuit formed on the semiconductor substrate coupled to receive the reference voltage from the charge pump, the second bootstrap refresh circuit further coupled between the first and second bootstrap nodes of the DC/DC converter, the second bootstrap refresh circuit to supply second charge current from the second bootstrap node to the first bootstrap node based on the control signal indicating a second operating mode of the DC/DC converter.

19. The integrated circuit of claim 18, wherein each of the first and second bootstrap refresh circuits further comprises a refresh control circuit to control the first charge current and the second charge current, respectively, based on the reference voltage.

20. The integrated circuit of claim 19, wherein each of the refresh control circuits drives an associated charge circuit that supplies the first charge current and second charge current, respectively, to each of the first and second bootstrap nodes based on a current signal and the control signal indicating one of the first or second operating modes.

* * * * *